(12) United States Patent
Orita et al.

(10) Patent No.: US 6,385,050 B1
(45) Date of Patent: May 7, 2002

(54) COMPONENT HOUSING DEVICE

(75) Inventors: Katsuyoshi Orita, Aichi; Masamichi Morioka, Shizuoka; Hiroshi Yoneyama, Aichi, all of (JP)

(73) Assignees: Sony Corporation, Tokyo; Yazaki Industrial Chemical Co., LTD, Shizuoka, both of (JP)

( * ) Notice: Subject to any disclaimer, the term of this patent is extended or adjusted under 35 U.S.C. 154(b) by 0 days.

(21) Appl. No.: 09/147,665
(22) PCT Filed: Jun. 18, 1998
(86) PCT No.: PCT/JP98/02727
§ 371 Date: Jun. 14, 1999
§ 102(e) Date: Jun. 14, 1999
(87) PCT Pub. No.: WO98/57873
PCT Pub. Date: Dec. 23, 1998

(30) Foreign Application Priority Data

Jun. 18, 1997 (JP) .......................................... 09-005744
Jan. 22, 1998 (JP) .......................................... 10-010561

(51) Int. Cl.[7] ........................... H05K 7/14; B65D 85/38
(52) U.S. Cl. ...................... 361/759; 361/753; 361/797; 361/801; 211/41.17; 312/215

(58) Field of Search ................................. 361/730, 740, 361/752, 753, 756, 759, 796, 801, 802, 810; 211/41.17; 174/52.1; 220/4.02

(56) References Cited

U.S. PATENT DOCUMENTS 5,390,083 A * 2/1995 Decker et al. ............... 361/796
5,593,046 A * 1/1997 Katsuura et al. .......... 211/41.17

* cited by examiner

Primary Examiner—Jayprakash N. Gandhi
(74) Attorney, Agent, or Firm—Jay H. Maioli

(57) ABSTRACT

A housing device 100 for plural components that can be arrayed one on top of another includes a support 101 for housing the components on introducing the latter into the support, and a locking unit 102 configured for preventing the components housed in the support 101 from being moved out of the support 101. The housing device 100 also includes a base member 103 having an unlocking support 101 which is adapted to release the state of the locking unit 102 prohibiting the movement of the components housed in the support 101. The components to be housed are usually locked by the locking unit 102. The locked state of the components is established by simply placing the components into the support and is released by the unlocking support 101. A larger number of the components can be housed on top of each other if so desired.

12 Claims, 17 Drawing Sheets

COMPONENT HOUSING DEVICE

This is a 371 of international application PCT/JP98/02727, with an international filing date of Jun. 18, 1998, the disclosure of which is incorporated into this application by reference.

TECHNICAL FIELD

This invention relates to a component housing device usable for example as a container for housing a printed circuit board.

BACKGROUND ART

A housing container for printed circuit boards is used for housing a large number of printed circuit boards for storage in a warehouse, and for transporting a large number of printed circuit boards to an assembling line for electronic parts.

This sort of the containers for printed circuit boards is known for example, from the Japanese Laying-Open Patent S-58-125474.

A large number of printed circuit boards can be arrayed side-by-side by being fitted in grooves formed in the container. There is provided a stop bar for preventing the printed circuit boards housed in the container from being moved or popping out sporadically during transport. This stop bar, while being movable, has its movement halted by a spring and ribs.

For taking out the printed circuit boards from the container or housing the printed circuit boards in the container, this stop bar needs to be moved manually so as not to obstruct insertion or extraction of the printed circuit boards.

In the case of a fully halted stop bar not having this movable stop bar, there is required an operation of dismounting the stop bar from the container or securing the stop bar with respect to the container. The operation of opening/closing or mounting/dismantling the stop bar is an extremely time- and labor-consuming operation.

Although the container can be transported in a state in which the printed circuit board is not locked by the stop bar, there is raised in such case a problem that the printed circuit board tends to disengage from the container.

It is a frequent occurrence that a variety of sizes of the printed circuit boards are housed in this type of the container. If the size of the printed circuit board is smaller than the size of the container, it is desirable that a larger number of printed circuit boards be housed in the container. In a certain conventional container, a demand for housing printed circuit boards of narrower widths is met by moving a movable side member, with a reference side member remaining stationary, for producing a spacing matched to the printed circuit boards of the narrower widths, with the printed circuit boards of the narrower widths being housed in grooves provided in this spacing. This type of the conventional container cannot house a larger number of printed circuit boards of smaller sizes.

DISCLOSURE OF THE INVENTION

It is therefore an object of the present invention to overcome the above problem and to provide a container in which components such as printed circuit boards desired to be housed are usually locked, where the locked state of the housed components can be automatically relinquished and where a larger number of components can be housed in an arrayed state.

The present invention provides a component housing device for housing a plurality of components side-by-side, including a support for housing the components side-by-side on inserting the components thereon, lock means for preventing the components housed in the support from popping out therefrom and a base member having unlock means for releasing, when the supporting member is set thereon, the state of the lock means prohibiting sporadic movements of the components housed in the support.

In the component housing device of the present invention, the support holds the components side-by-side. The lock means prohibits the components housed in the support from being moved out from the support. When the support is set on the base member, the unlock means provided in the base member releases the state of the lock means locking the components housed in the support against movements. This enables the lock means to prohibit the components in the housing device from being moved out from the housing device during normal use. If the support is set on the base member, the unlock means provided on the base member can release the state of the lock means locking the components housed in the support against sporadic movements.

In the component housing device according to the present invention, the unlock means includes a thrusting member adapted for thrusting the lock means on setting the support on the base member for holding the lock means in an unlock position which permits the components housed in the component housing device to be moved from a lock position prohibiting movement of the housed components. Thus, on simply setting the support on the base member, the thrusting member of the unlock means resets the lock means from the lock position to the unlock position.

If, in this case, the thrusting member is adapted to rotate the lock means to the unlock position to hold it in the latter position, the lock means can be easily moved from the lock position to the unlock position to hold it in this unlock position.

In the component housing device according to the present invention, the thrusting member can be moved and positioned on the base member. By enabling the thrusting member to be positioned, the thrusting member can be suitably positioned on the base member responsive to the size of the support or the position of the lock means to enable the operations to be performed for releasing the locking state of the lock means.

If, in the component housing device of the present invention, the base member includes positioning means, this positioning means can position the support with respect to the base member reliably when the support is set on the base member. This assures unlocking reliably.

In the component housing device according to the present invention, the support is made up of a first housing member and a second housing member, and the separation therebetween is adjustable to enable the components to be reliably housed therebetween in conformity to the size of the components to be housed in the component housing device.

In the component housing device of the present invention, the printed circuit boards can be inserted into grooves provided in the support to permit the printed circuit boards to be introduced or taken out by sliding along these grooves.

In the component housing device of the present invention, the lock bar can be positioned at the unlock position by, for example, the positioning means, while the lock bar can be held by the biasing means in the lock position. Thus, the printed circuit boards housed in the support usually can be reliably locked by the lock bar of the lock means. If the lock bar is moved to the unlock position, the components can be introduced into the space between the first housing member and the second housing member, or the components can be taken out from the space between the first housing member and the second housing member.

Also, in the component housing device according to the present invention, the unlock means for the base member can shift the lock bar from the lock position to the first unlock position. The unlock means of the base member can shift the lock bar from the lock position to a second unlock position further away from the lock position than the first unlock position to position the lock bar in this second unlock position. When the lock bar is moved by the first actuating member from the lock position to the first unlock position for positioning, the components can be taken out form or introduced into the support. Also, if the lock bar is moved by the second actuating member from the lock position to the second unlock position for positioning, the lock bar can be positioned at the second unlock position further away from the housed components. This desirably facilitates insertion or detachment of the components especially in case the lock bar is to be held for prolonged time in the unlocked state for testing the components.

The present invention also provides a component housing device for housing a plurality of components side-by-side, including a support having a first housing member and a second housing member which is adapted to hold the components side-by-side on introducing the components between the first housing member and the second housing member, lock means for preventing the components housed in the supporting member from popping out from the supporting member, a base member having unlock means for releasing the state of lock means prohibiting movements of the components housed in the support when the support is set on the base member, first connection means for upholding a separation between the first housing member and the second housing member of the support at a position, second connection means for upholding the separation between the first housing member and the second housing member of the support at a different position and space subdividing means arranged between the first connection means and t the second connection means for subdividing the space for housing plural components between the first housing member and the second housing member.

In the component housing device of the present invention, components are housed side-by-side in the support. The lock means prohibit the components housed in the support from being moved out of the support. When the support is set on the base member, the unlock means provided on the base member releases the state of the lock means locking the components housed in the support against sporadic movements. This enables prevention movement of the components housed in the housing device from the housing device by the lock means. If the support is set on the base member, the state of the lock means locking the components in the support against movement can be automatically relinquished by the unlock means.

The space subdividing means subdivides the space between the first and second housing members for accommodating plural components. By using this space subdividing means, even components of smaller size can be accommodated between the first and second housing members with the space subdividing means as partitioning means. That is, a larger number of components can be housed in the subdivided space, with the space subdividing means as a boundary, if the components are of smaller size.

In the component housing device of the present invention, the space subdividing means is detachably mounted under a biasing force between the first and second connection means. Thus, if the space subdividing means is not required, it can be easily removed from an area between the first and second connecting means. If the space subdividing means is used, it can be reliably mounted under this biasing force between the first and second connection means.

In the component housing device of the present invention, the space subdividing means is a rod which can be extended or contracted along the axial direction against the force of the biasing means. Thus, the space subdividing means can be pushed against the force of the biasing means in the axial direction so as to be mounted or dismounted between the first and second connecting means. By these first and second connecting means, the separation between the first and second housing members can be rendered adjustable to enable the components to be reliably housed in the support even if the components to be housed are different in size.

In the component housing device of the present invention, the first connection means has a positioning member for positioning an end of the space subdividing means and the second connection means has a positioning member for positioning the opposite end of the space subdividing means. Since the one end and the opposite end of the space subdividing means can be reliably positioned relative to the first and second connection means, there is no risk of the space subdividing means being shifted in its position in the support.

Also, in the component housing device of the present invention, the component is a printed circuit board, a first printed circuit board is inserted from one side of the support to compress against the space subdividing means and a second printed circuit board is inserted from the opposite side of the support to compress against the space subdividing means, whereby the printed circuit boards are accommodated in the support.

BEST MODE FOR CARRYING OUT THE INVENTION

Figure 1:
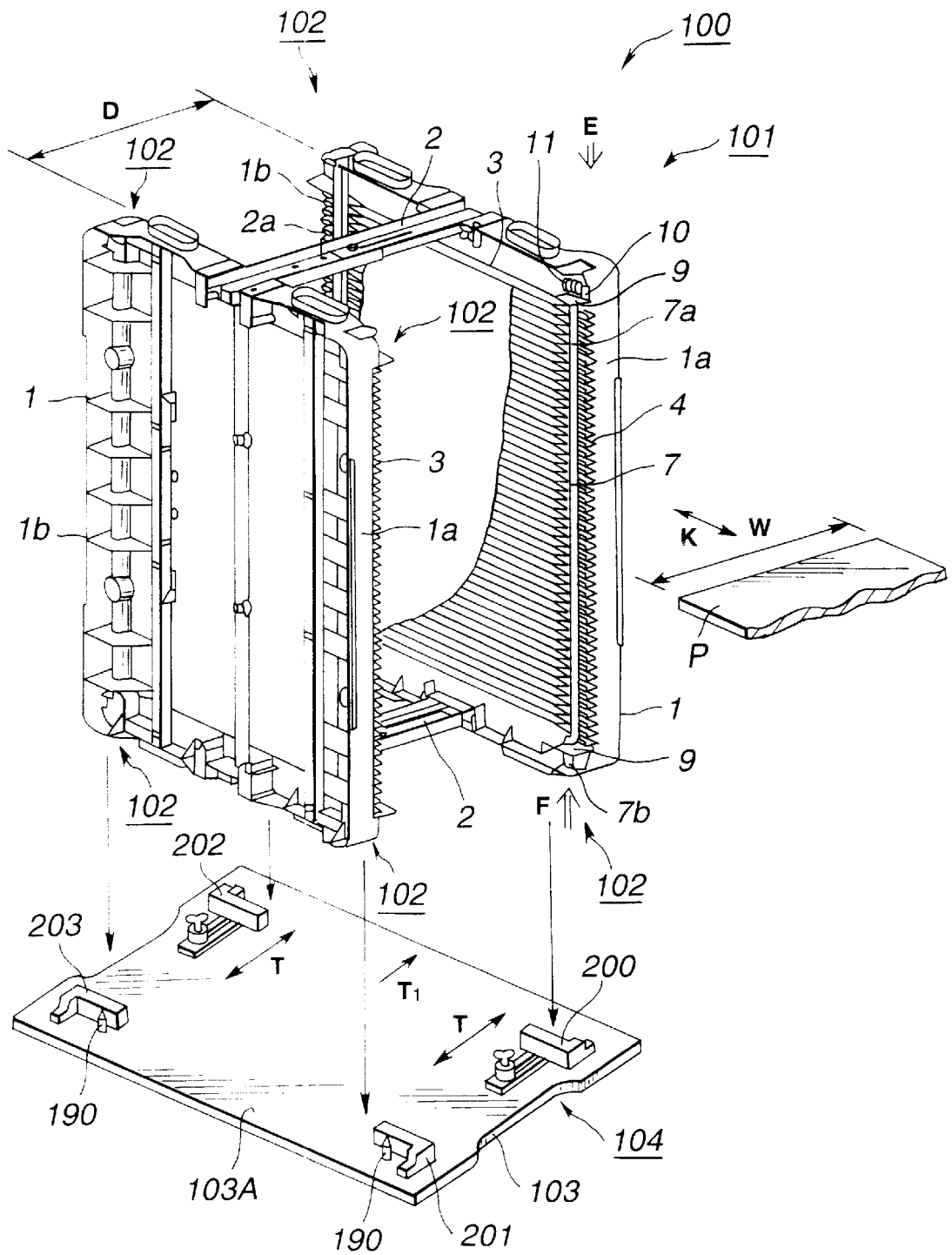
FIG. 1 is an exploded perspective view showing essential portions of a container for components according to a preferred embodiment of the present invention.

Referring to the drawings, preferred embodiments for carrying out the present invention will be explained in detail.

Since the embodiment now explained represents a preferred illustrative embodiment of the present invention, a variety of technically desirable limitations are imposed thereon. However, the scope of the present invention is not limited to these embodiments, unless contrary statements are made in the following description.

FIG. 1 shows a present embodiment of a component housing device 100 according to the present invention.

The component housing device 100, shown in FIG. 1, includes a support 101, a lock unit 102 and a base member 103.

This base member 103 has an unlock support 104.

The component housing device 100 shown in FIG. 1 is a housing container, for example, adapted for housing a plurality of or a large number of printed circuit boards P side-by-side and transporting the housed printed circuit boards P.

Figure 2:
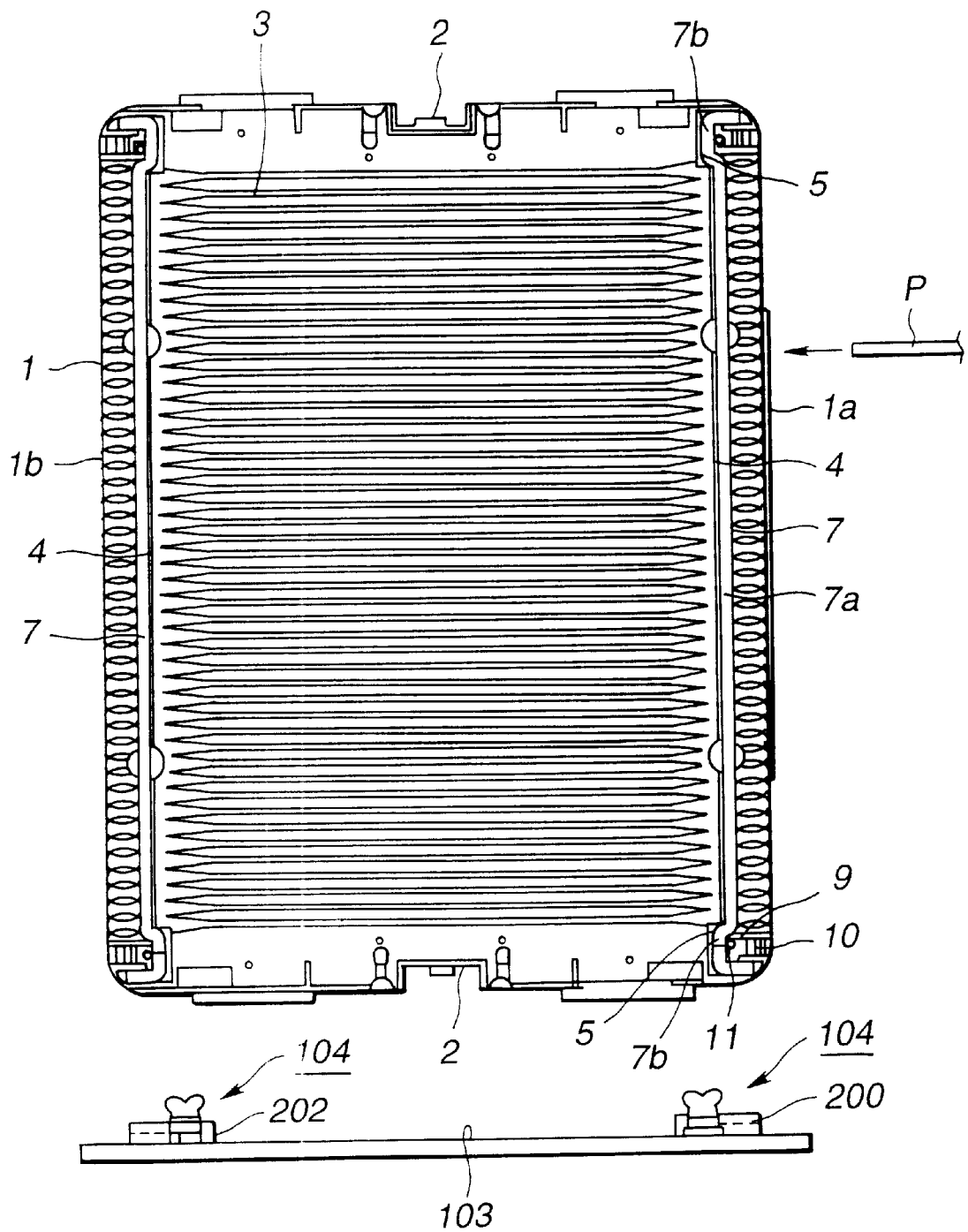
FIG. 2 is a side view showing one of printed circuit board housing plates and a base member of a housing device for components.

The support 101 is explained first with reference to FIGS. 1 and 2.

The support 101 has a pair of printed circuit board housing plates 1, 1 and a pair of connecting members 2, 2.

The printed circuit board housing plates 1, 1, arranged on left and right sides for facing each other, are rectangular plate-shaped members formed of, for example, electrically conductive plastics.

The connecting members 2, 2 interconnect the upper and lower sides of the printed circuit board housing plates 1, 1. By slackening screws 2a, the separation D between the printed circuit board housing plates 1, 1 can be adjusted in the increasing or decreasing direction for matching to the width W of the printed circuit boards P to be housed in the printed circuit board housing plates 1, 1. These connecting members 2, 2 are formed of, for example, metal.

In the inner surfaces of the printed circuit board housing plates 1, 1 are horizontally formed a large number of circuit board inserting grooves 3. The length of the circuit board inserting grooves 3 is slightly shorter than the width of the circuit board housing plate 1.

In the vicinity of the forward portion 1a and a rear portion 1b of each circuit board housing plate 1 are formed lock bar holding grooves 4, 4 for extending in a direction perpendicular to the direction of the circuit board inserting grooves 3 (horizontal direction), that is along the length of the circuit board housing plate 1. The depth of the lock bar holding grooves 4, 4 is set so as to be deeper than that of the circuit board inserting grooves 3.

The lock unit 102 of FIG. 1 is now explained. The lock unit 102 is preferably provided in the forward portion 1a and in the rear portion 1b of each of the printed circuit board housing plates 1, 1 of the support 101. The lock unit 102 has the following structure.

The lock unit 102 has a lock bar 7, a tension coil spring 11, as a biasing member for the lock bar 7 and a stop 9 as positioning means for the lock bar 7.

The lock bar 7, that can be fabricated from metal or plastics, is formed for extending along a lock bar holding groove 4 provided in the circuit board housing plate 1. That is, the lock bar 7 is arranged parallel to the longitudinal direction of the circuit board housing plate 1.

An upper end and a lower end of the lock bar 7, provided with a lock portion 7a, are formed with bends 7b, 7b, as shown in FIGS. 1, 2, 8 and 9. The bends 7a, 7b are substantially U- or C-shaped and are formed by warping one and the opposite ends of the lock portion 7a.

Figure 13:
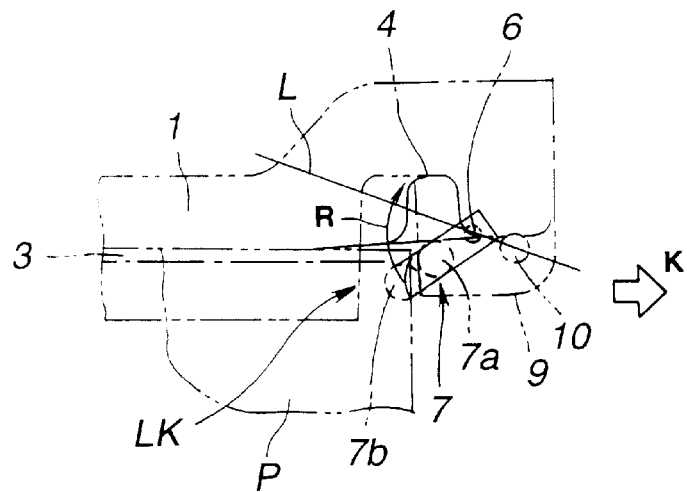
FIG. 13 is a plan view showing the locked state of the lock bar used for locking the printed circuit board in place.
Figure 14:
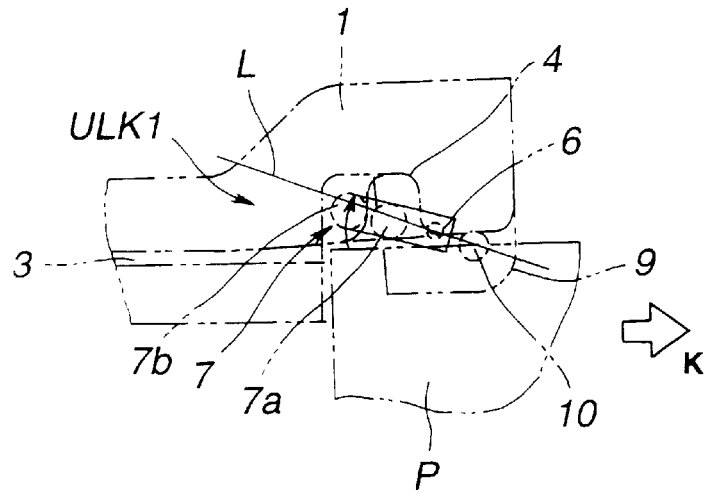
FIG. 14 is a plan view showing the state in which the lock bar is positioned in its unlock position.
Figure 15:
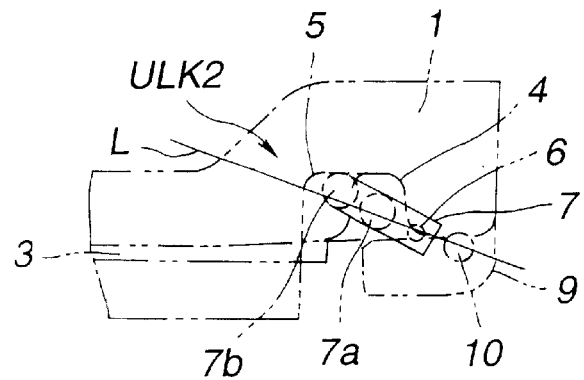
FIG. 15 is a plan view showing the state in which the lock bar is set in a second unlock position.

The bends 7b, 7b are adapted for being held in upper and lower bend holding recesses 5 formed in the inner surfaces of the circuit board housing plate 1. The bends 7b, 7b are adapted for being rotated about a pivot 6 in the direction indicated by arrow R of FIGS. 6 and 7, as shown in FIGS. 13 to 15. This pivot 6 is provided in each of the upper and lower ends of the circuit board housing plate 1 shown in FIGS. 1 and 2.

The lock bar 7 is of a thickness such that the lock bar 7 is fitted in the lock bar holding groove 4, as shown in FIG. 2.

When the printed circuit board P is inserted into circuit board holding grooves 3, 3, facing each other, the lock bar 7 is positioned at a lock position LK, in order to prevent the printed circuit board P from exiting in the direction indicated by arrow K in FIG. 13 in a state in which the printed circuit board P is inserted in the circuit board holding grooves 3, 3.

If the printed circuit board P is to be taken out in the direction indicated by arrow K in FIG. 14, the lock bar 7 is positioned in the first unlock position ULK1.

In case of testing of electronic parts loaded on the printed circuit board P, the lock bar 7 is adapted for being positioned at the second unlock position UNK2 for prolonged time, as shown in FIG. 15.

Figure 8:
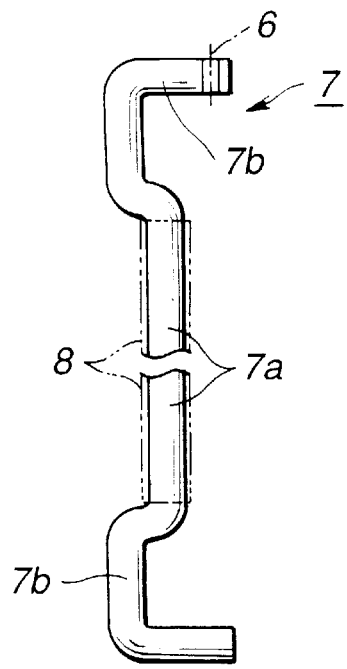
FIG. 8 is a side view showing an example of a lock bar of the lock mechanism, partially not shown.

The lock portion 7a of the lock bar 7 is provided with a sleeve 8, as shown in FIG. 8. This sleeve 8 is formed of, for example, highly lubricious plastics. Since the sleeve 8 is mounted preferably for rotation relative to the lock portion 7a, the printed circuit board P can be smoothly introduced or ejected if the lock bar 7 is positioned at the first unlock position UNK1, the lateral side portion of the printed circuit board P then sliding along the sleeve 8.

The stop 9, shown in FIGS. 13 to 15, serving as positioning means for the lock bar 7 in the rotational direction, is located in the vicinity of the bend 7b of the lock bar 7, and has the following function. That is, the stop 9 can set the lock bar 7 at the lock position LK by being abutted against the bend 7b of the lock bar 7, as shown in FIG. 13. Moreover, by the bend 7b of the lock bar 7 thus compressing against the stop 9, the lock bar 7 can be positioned at the second unlock position UNK2 on the side of the holding groove for the stop 9.

Figure 4:
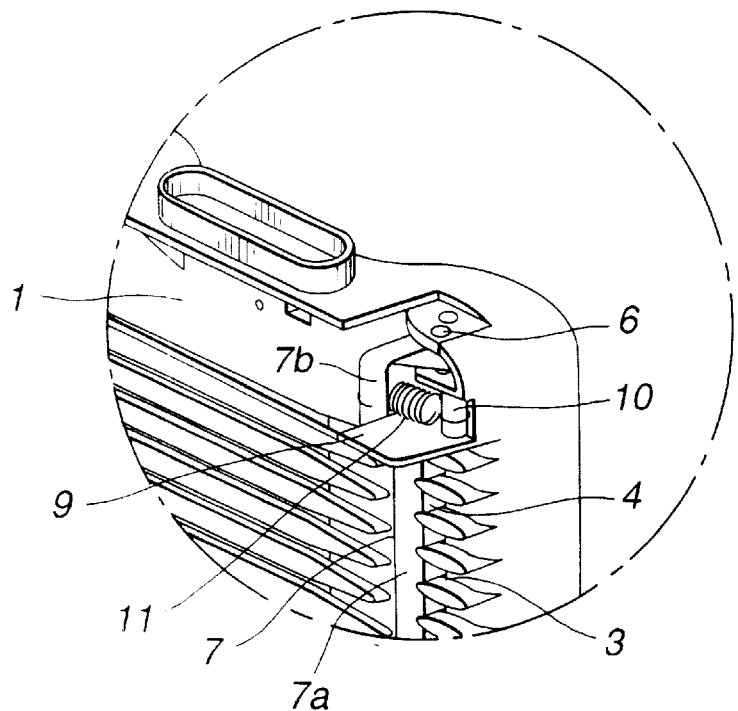
FIG. 4 is a partial enlarged view showing the base member and the unlock mechanism.
Figure 5:
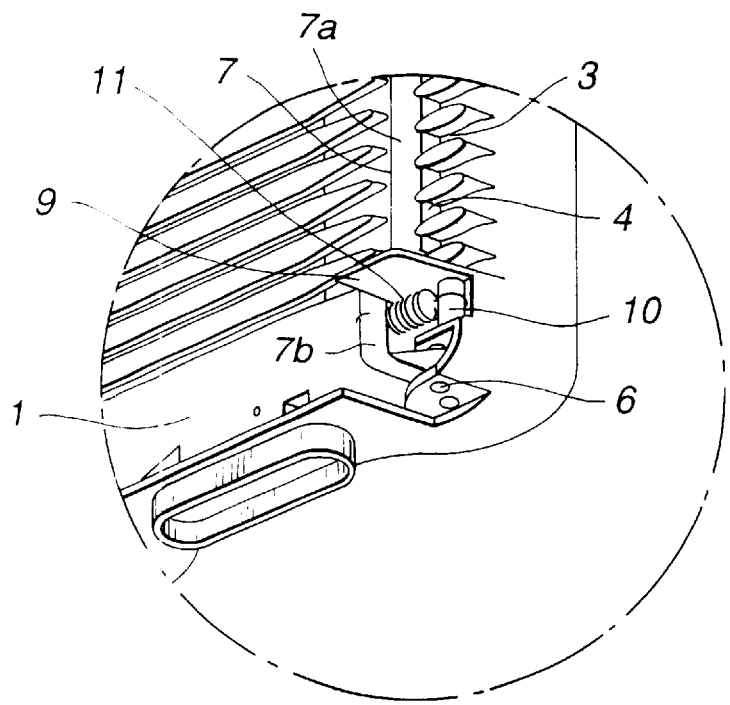
FIG. 5 is a partial enlarged view looking from the direction of arrow E in FIG. 1.

The tension coil spring 11, shown in FIG. 1, operating as biasing means for the lock unit 102, shown in FIGS. 4 and 5, is provided in association with each bend 7b. The tension coil spring 11 is mounted between a spring retention pin 10 and the bend 7b. The tension coil spring 11 pulls the lock bar 7 to a lock position LK shown in FIG. 13 for positioning the lock bar 7 relative to the stop 9.

Figure 6:
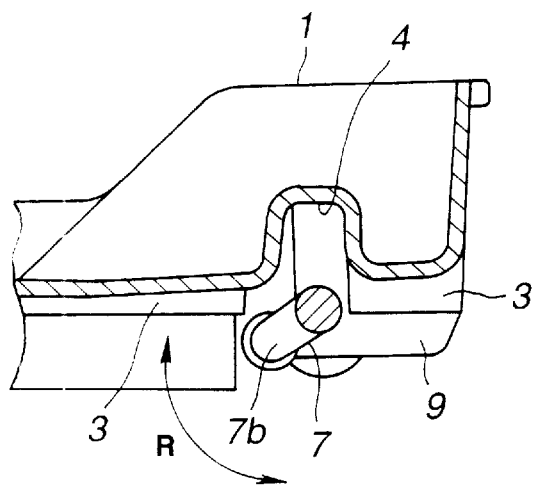
FIG. 6 is a cross-sectional view showing the top portion of the lock mechanism shown in FIG. 2.
Figure 7:
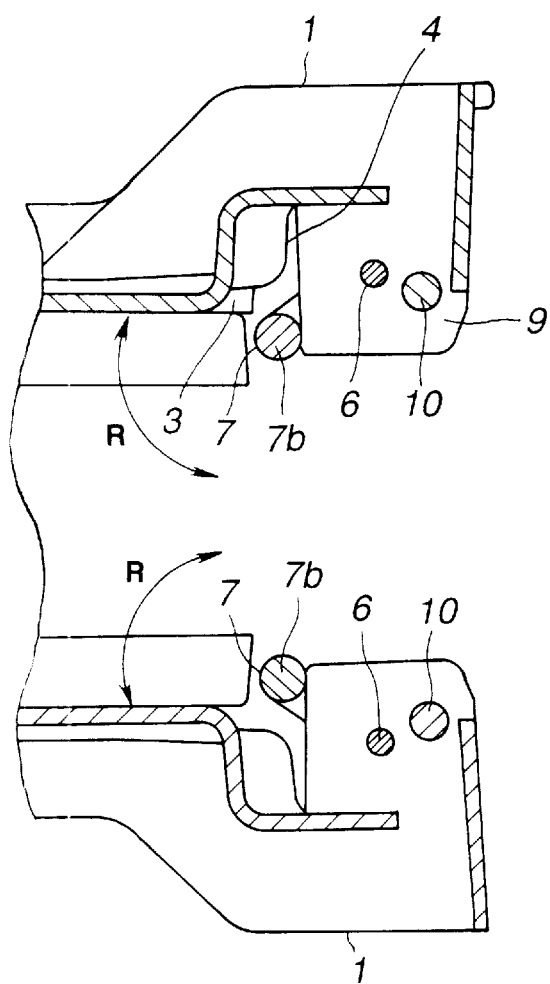
FIG. 7 is a cross-sectional view showing the lower portion of the lock mechanism of FIG. 2.

In FIGS. 13 to 15, there is shown a straight line traversing the center of the pivot 6 and the spring retention pin 10. The tension coil spring 11 can bias the lock bar 7 into rotation towards the first unlock position UNK1 shown in FIG. 14, second unlock position UNK2 shown in FIG. 15 or towards the lock position LK shown in FIG. 13, about the straight line L as a boundary. Referring to FIGS. 6 and 7, the bend 7b of the lock bar 7 is positioned outside of the insertion groove 3 at the lock position LK in FIG. 13.

Figure 3:
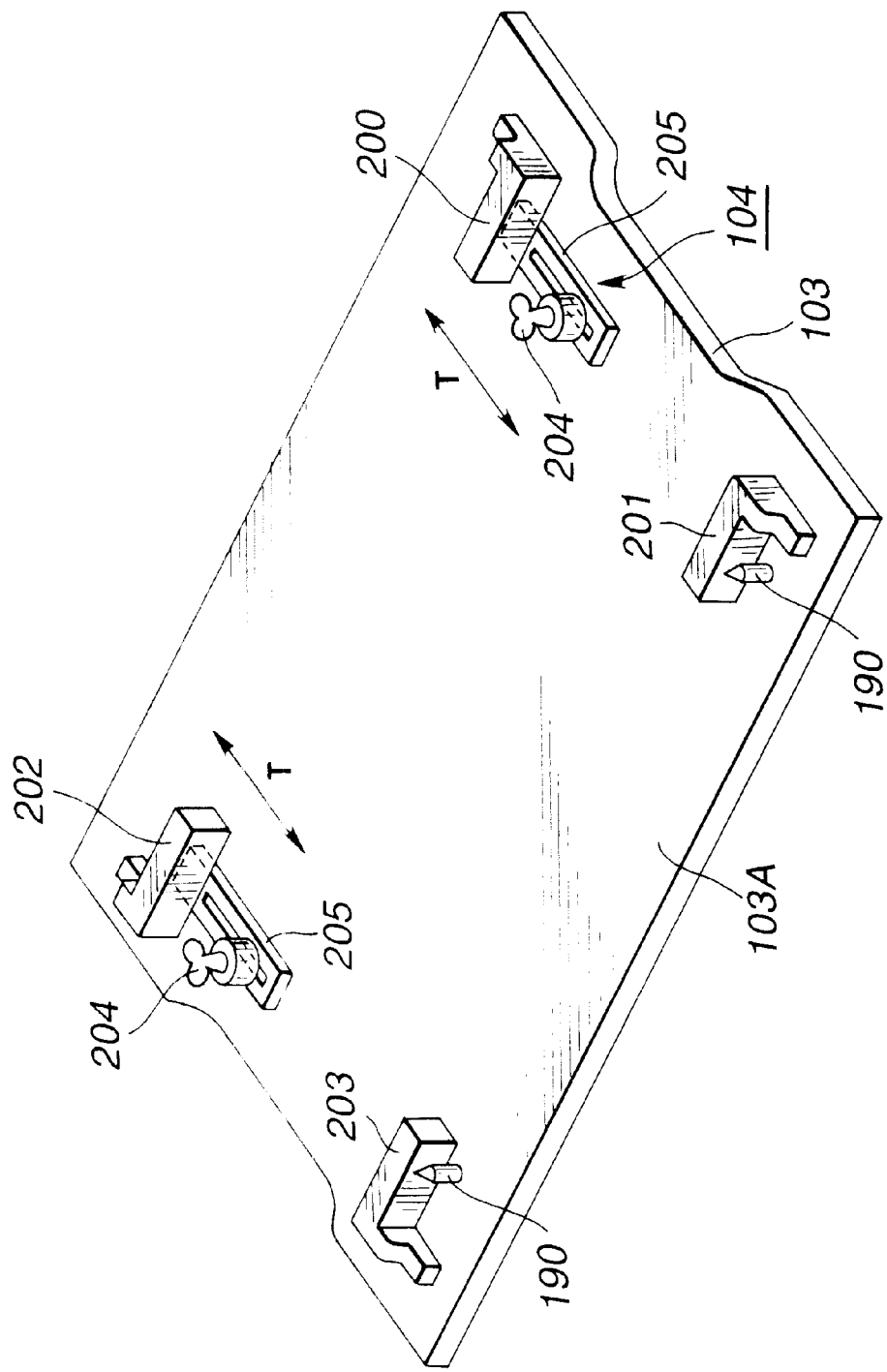
FIG. 3 is a perspective view showing a base member and an unlock mechanism.

The base member 103 and the unlock support 104 of FIGS. 1 to 3 are now explained.

The base member 103 serves as a base block for setting the lower portions of the circuit board housing plates 1, 1 of the support 101. The base member 103, that may be fabricated from metal or plastics, is a flat rectangular plate. This base member 103 can be transported on, for example, a conveyor, with the support 101 having been set thereon.

The unlock support 104 is provided on the base member 103. This base member 103 and the unlock support 104 are shown in FIGS. 1 to 3. The base member 103 is provided with positioning pins 190, 190, operating as positioning means, in addition to the unlock support 104.

The unlock support 104 is provided with thrusting members 200 to 203 formed of, for example, plastics.

The thrusting members 200, 202 can be moved on an upper surface 103A of the base member 103 in the direction indicated by arrow T, that is along the direction of the connecting members 2 of the support 101 of FIG. 1, and can be secured in position by a screw 204. This screw 204 is, for example, a thumbscrew that can be turned manually by an operator. The screw 204 can be used to tighten a guide 205 of the thrusting member 200 relative to the base member 103 to prevent the thrusting member 200 against movement in the direction indicated by arrow T, the screw 204 thus serving for securing the thrusting member 200 with respect to the base member 103.

The thrusting members 200, 202 are adapted for being moved in the direction indicated by arrow T in order to match the thrusting members 200, 202 to the setting position of the circuit board housing plates 1, 1 of the support 101 of FIG. 1 depending on the sort and the size of the support 101.

On the other hand, the thrusting members 201, 203 are previously secured to the base member 103. In the vicinity of the thrusting members 201, 203, there are provided the above-mentioned positioning pins 190, 190 for extending upwards.

Figure 9:
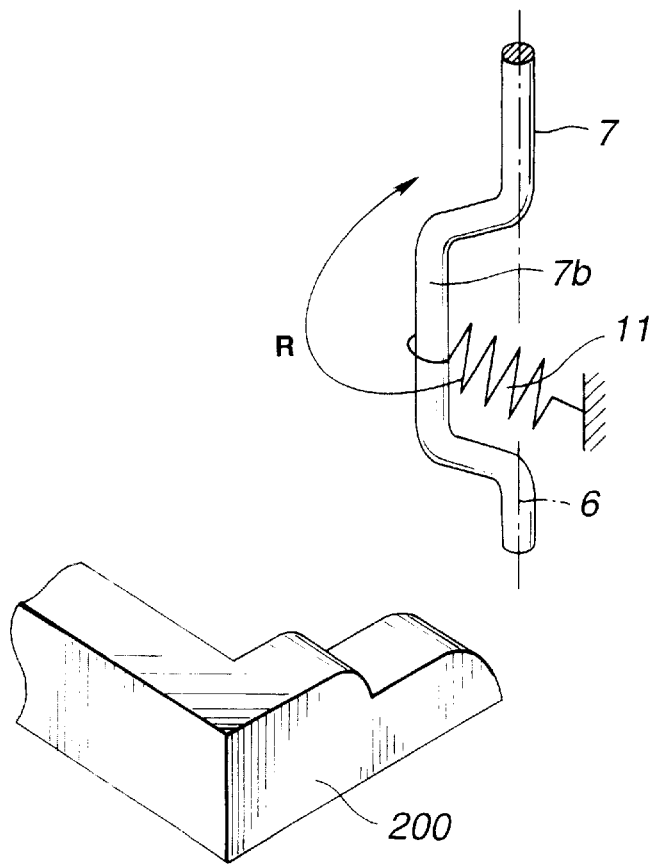
FIG. 9 is a perspective view showing a portion of a lock bar and an unlock mechanism.
Figure 10:
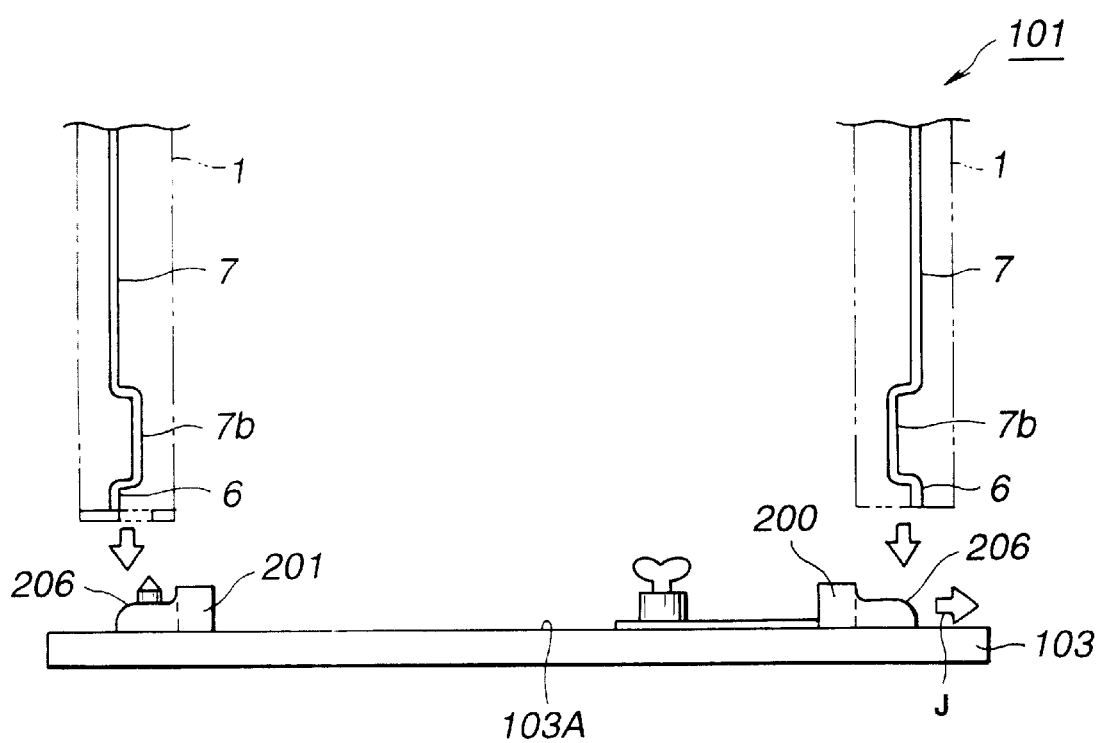
FIG. 10 is a front view showing a lock bar and an unlock mechanism of a base member.

Referring to FIGS. 9 to 11, the shape and the function of the thrusting members 200 to 203 are explained.

Figure 11A:
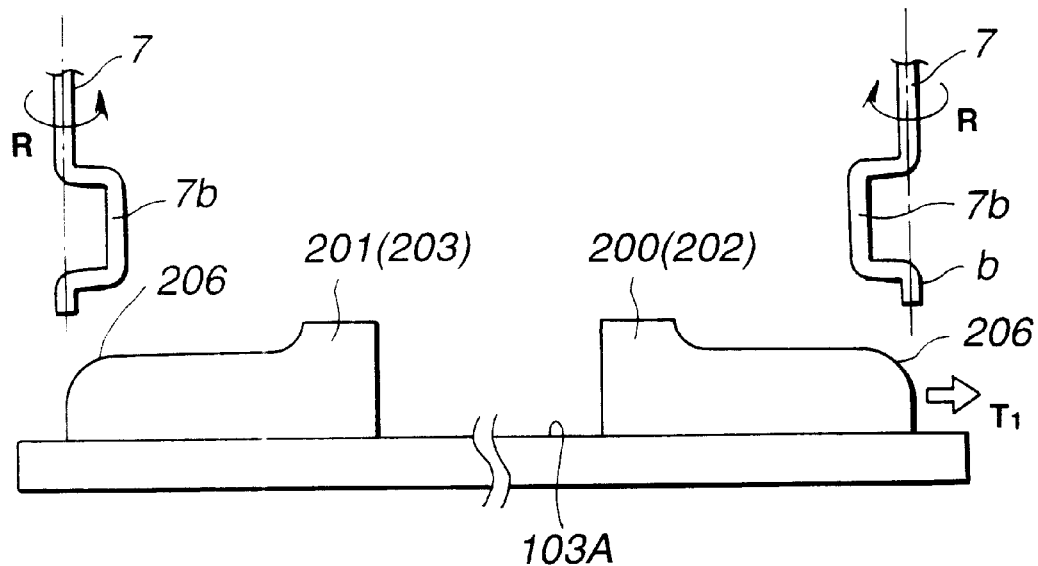
FIGS. 11A and 11B are front views showing the state prior to setting a supporting member on a base member, with the lock bar in the lock position, and the state after setting the supporting member on the base member, with the lock bar being thereby rotated and moved to an unlock position, respectively.
Figure 11B:
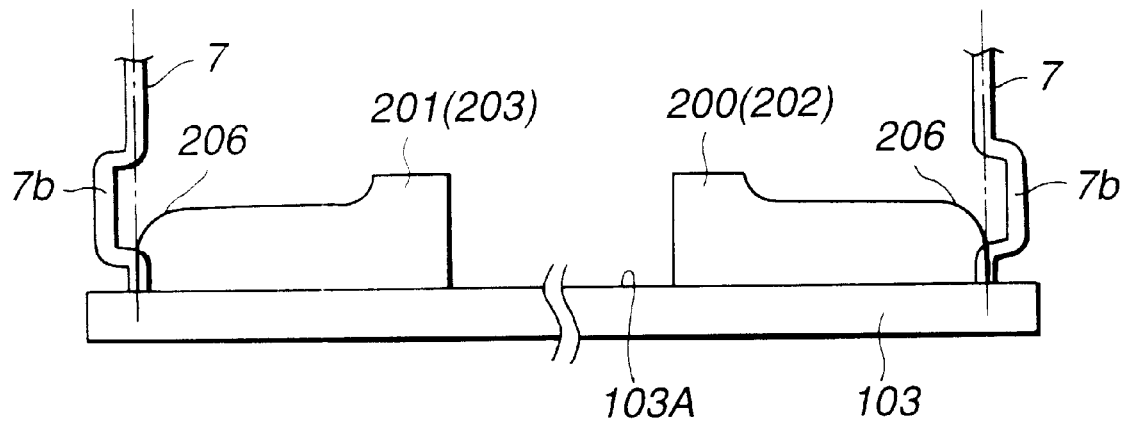

FIG. 9 shows the vicinity of the lower bend 7b of the lock bar 7 and the vicinity of the thrusting member 200. FIG. 10 shows the thrusting members 200, 201 and the bends 7b, 7b of the lock bar 7 associated therewith. FIGS. 11A and 11B show the state before and after setting the left and right printed circuit board housing plates 1, 1 on the base member 103, respectively.

Figure 12:
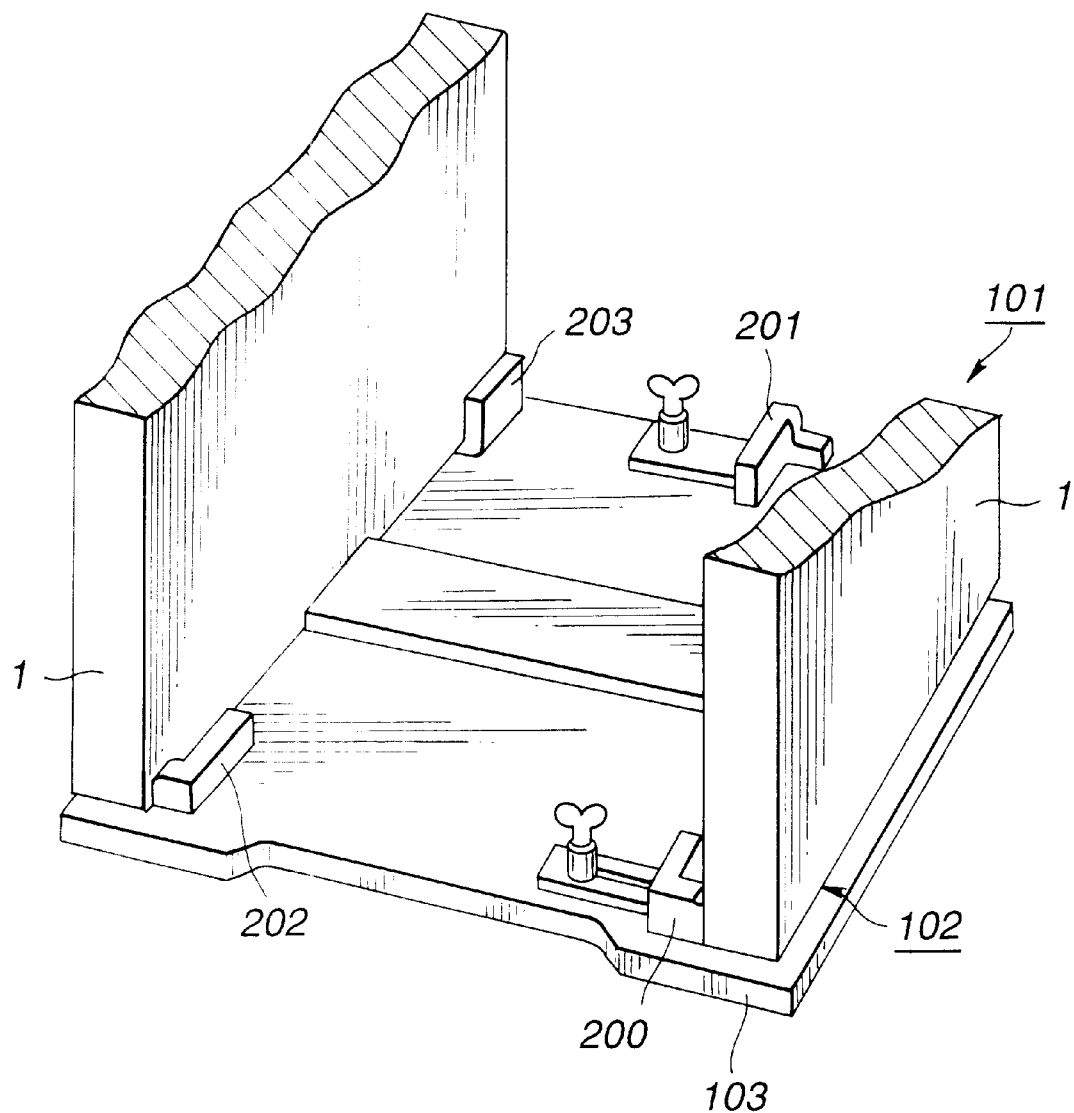
FIG. 12 is a perspective view showing the state in which the supporting member is set on the base member.

FIG. 12 shows the state in which the printed circuit board housing plates 1, 1 have been set on the upper surface 103A of the base member 103.

The thrusting members 200, 201 are of a similar shape, as shown in FIGS. 9 to 11. It is noted that each of the thrusting members 200 to 203 has a curved surface 206 capable of thrusting the bend 7b of the descending lock bar 7 to rotate it in the direction indicated by arrow R as shown for example in FIGS. 11A and 11B. That is, at the same time as the support 101 is set on the upper surface 103A of the base member 103, the bend 7b of the lock bar 7 is thrust by the curved surface 206 of the thrusting member 200 to rotate the lock bar 7 about the pivot 6 as the enter of rotation.

As may be seen from this, the lock bar 7 can forcibly be rotated, against the force of the tension coil spring 11 of FIG. 9, from the lock position LK shown in FIG. 13 to the first unlock position UNK1 shown in FIG. 14.

If necessary, the thrusting member 200 or 202, shown in FIGS. 10, 11A and 11B, can be moved in the direction indicated by arrow T to shift the bend 7b of the lock bar 7 from the lock position LK shown in FIG. 13 further to the second unlock position UNK2 shown in FIG. 15, against the force of the tension coil spring 11.

The operation of the above-described component housing device 100 is hereinafter explained.

The separation D between the printed circuit board housing plates 1, 1 is set by the connecting members 2, 2 in association with the width W of the printed circuit board P. In the circuit board inserting grooves 3 in the printed circuit board housing plates 1, 1 are inserted a number of printed circuit boards P side-by-side for extending horizontally.

As for the base member 103, the positions of the thrusting members 200, 202 of the unlock support 101 are previously set with respect to the direction of arrow T. As an illustrative setting of the thrusting members 200, 202, the thrusting member 200 is positioned in register with the lower lock unit 102 of the circuit board housing plate 1 on the right side of FIG. 1, as shown in FIG. 12. The opposite side thrusting member 202 is secured at a position retreated inwardly to clear the lock unit 102 of the right-hand side circuit board housing plate 1.

One or more printed circuit boards P are previously held between the printed circuit board housing plates 1, 1 of the support 101 of the component housing device 100. This support 101 is set on the base member 103.

At this time, the lower lock units 102, 102 on the left side of FIG. 1 are placed in register with the thrusting members 201, 203 of the base member 103, whilst the lock unit 102 lying on the forward side below the right-side circuit board housing plate 1 is placed in register with the right-side thrusting member 200.

At this time, the positioning pins 190, 190 are inserted into lower openings, not shown, formed in the left side circuit board housing plate 1, for positioning the support 101 on the base member 103. The three thrusting members 200, 202, 203 can be reliably positioned relative to three lock units 102 on the lower sides of the printed circuit board housing plates 1, 1.

In the present embodiment, the rear side thrusting member 202 has been moved to a position not in register with the rear lock unit 102 of the right-side circuit board housing plate 1. Since this does not relinquish the locked state of this rear side lock unit 102, the printed circuit board P can be prohibited from popping out at the time of insertion and withdrawal of the printed circuit board P into or from the support 101.

If the support 101 is placed on the upper surface 103a of the printed circuit board 103, as shown in FIG. 12, the bend 7b of the lock bar 7 is rotated in the direction indicated by arrow R by associated curved sides 206 of the thrusting members 200, 202, 203 shown in FIGS. 11A, 11B. The bend 7b of the lock bar 7 shown in FIG. 13 is rotated from the lock position LK to the first unlock position UNK1 shown in FIG. 14.

Since this rotates the lock portion 7a of the lock bar 7 about the pivot 6 as the center of rotation, the lock portion 7a is accommodated in the lock bar holding groove 4, as shown in FIG. 14. In this state, the lock portion 7a is positioned, against the force of the tension coil spring 11, at the first unlock position UNK1 not traversing the straight line L.

If the lock bar 7 is positioned at the first unlock position UNK1 as shown in FIG. 14, the lock portion 7a is preferably positioned so that the surface of the sleeve 8 provided on the outer periphery of the lock portion 7a is substantially flush with the bottom surface of the circuit board inserting groove 3, for thereby smoothing the insertion or withdrawal of the printed circuit board P in the direction indicated by arrow K. This permits the lateral side of the printed circuit board P to be guided in sliding contact with the sleeve 8 during insertion or withdrawal of the printed circuit board P, while optimizing abutment of the printed circuit board P without damaging it.

The lock bar 7 can thus automatically relinquish the locked state of the printed circuit board P.

If, in testing electronic parts loaded on the printed circuit board P, the lock bar 7 needs to be held for long in an unlocked state, the following operations are performed.

In this case, the sleeve 8 of the lock portion 7a of the lock bar 7, shown in FIG. 8, is desirably not abutted against the printed circuit board P at the time of insertion or withdrawal of the printed circuit board P in the direction indicated by arrow F. Thus, the lock bar 7 is positioned at the second unlock position UNK2, as shown in FIG. 15.

The thrusting member 200 is slightly moved on the base member 103 shown in FIG. 1 in the direction indicated by arrow T1 for protruding the curved side 206 further in the direction indicated by arrow T1. This abuts the bend 7b of the lock bar 7 against the protruded curved side 206 to produce further rotation of the lock bar 7 from the locked position LK shown in FIG. 13 to the second unlock position UNK2 shown in FIG. 15. This second unlock position UNK2, which traverses the straight line L, assures housing of the component in a further recessed position than the first unlock position UNK1.

Figure 16:
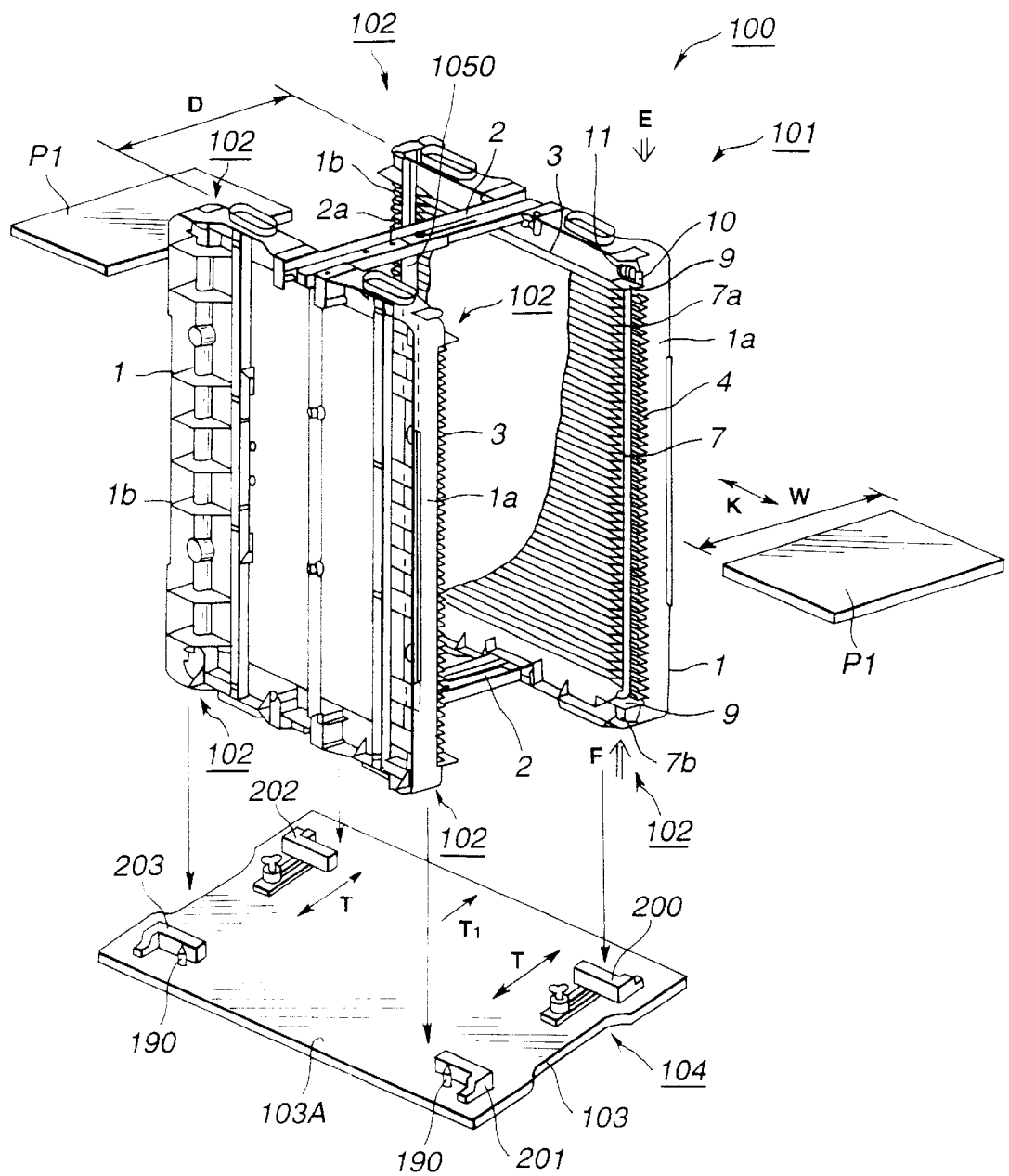
FIG. 16 is an exploded perspective view showing essential portions of a housing device for components according to another preferred embodiment of the present invention.

FIG. 16 shows a further embodiment of the present invention. The component housing device 100 shown in FIG. 16 has the structure and the operation substantially similar to those of the component housing device 100 of FIG. 1 and hence the same reference numerals are used to depict the same parts. The component housing device 100 of FIG. 16 differs from the component housing device 100 of FIG. 1 in the following respects.

An upper connecting member 2 represents first connection means for upholding the separation D between the printed circuit board housing plates 1, 1 of the support 101, while a lower connecting member 2 represents second connection means for upholding the separation D between the printed circuit board housing plates 1, 1. The present modification is similar in this respect to the embodiment shown in FIG. 1.

Figure 17:
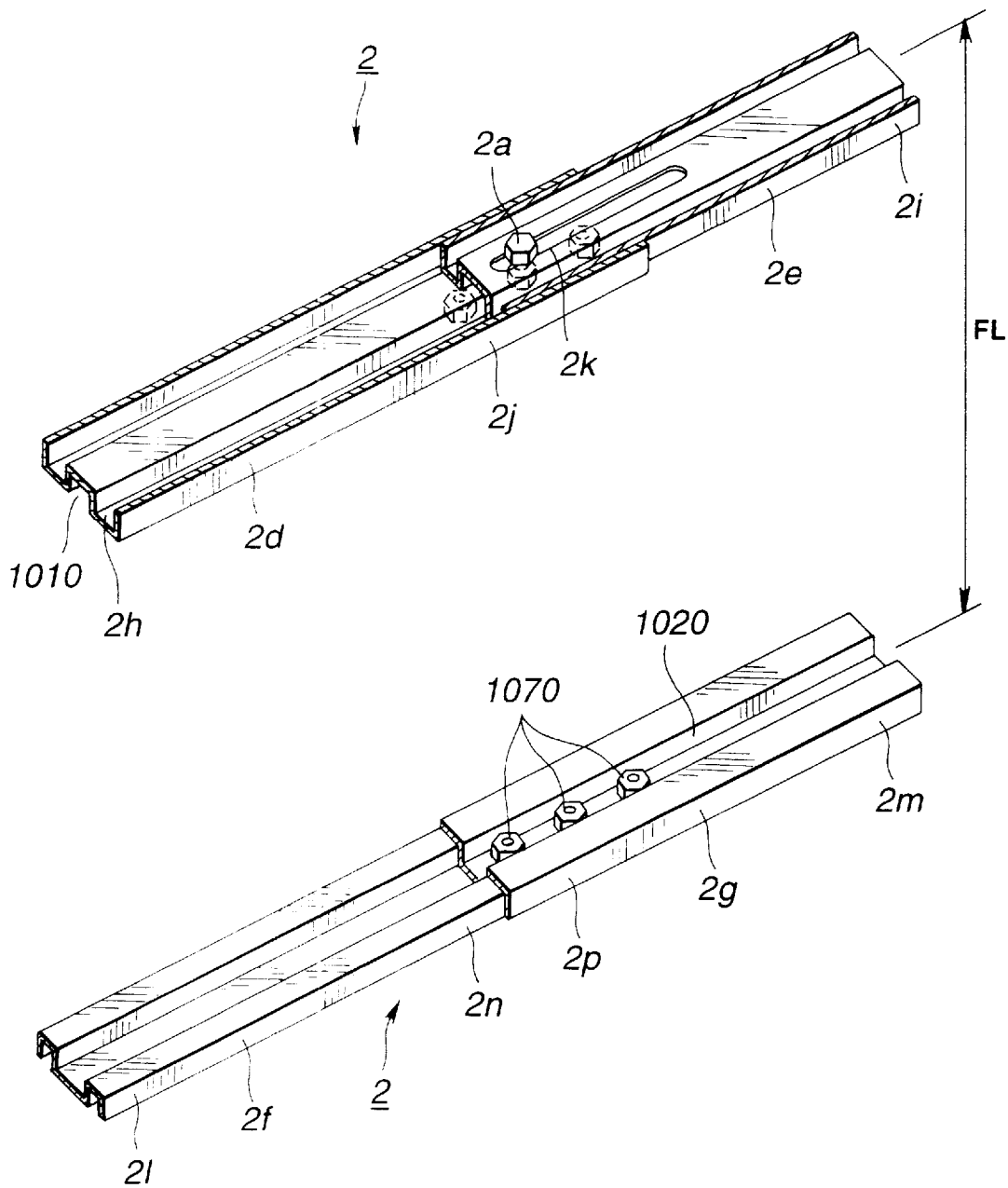
FIG. 17 is an enlarged perspective view showing an illustrative connecting member of a component housing device shown in FIG. 16.

The connecting members 2, 2 are mounted n the printed circuit board housing plates 1, 1 with a separation FL in-between, as shown enlarged in FIG. 17. The upper connecting member 2 has a connecting piece 2d and another connecting piece 2e, while the lower connecting member 2 has a connecting piece 2f and another connecting piece 2g. The connecting piece 2d has its one end 2h secured to an upper end of the circuit board housing plate 1 shown in FIG. 16. The connecting piece 2f has its one end 2i secured to the upper end of the opposite side circuit board housing plate 1. The opposite end 2h of the connecting member 2 is overlapped with the opposite end 2i of the connecting piece 2e.

The connecting piece 2f of the lower connecting member 2 has its one end 2l secured to the lower end of the circuit board housing plate 1 of FIG. 16, with an end 2m of the connecting piece 2g being secured to the lower end of the opposite side circuit board housing plate 1. The opposite end 2n of the connecting piece 2f is overlapped with the opposite end 2p of the connecting piece 2g.

Figure 18:
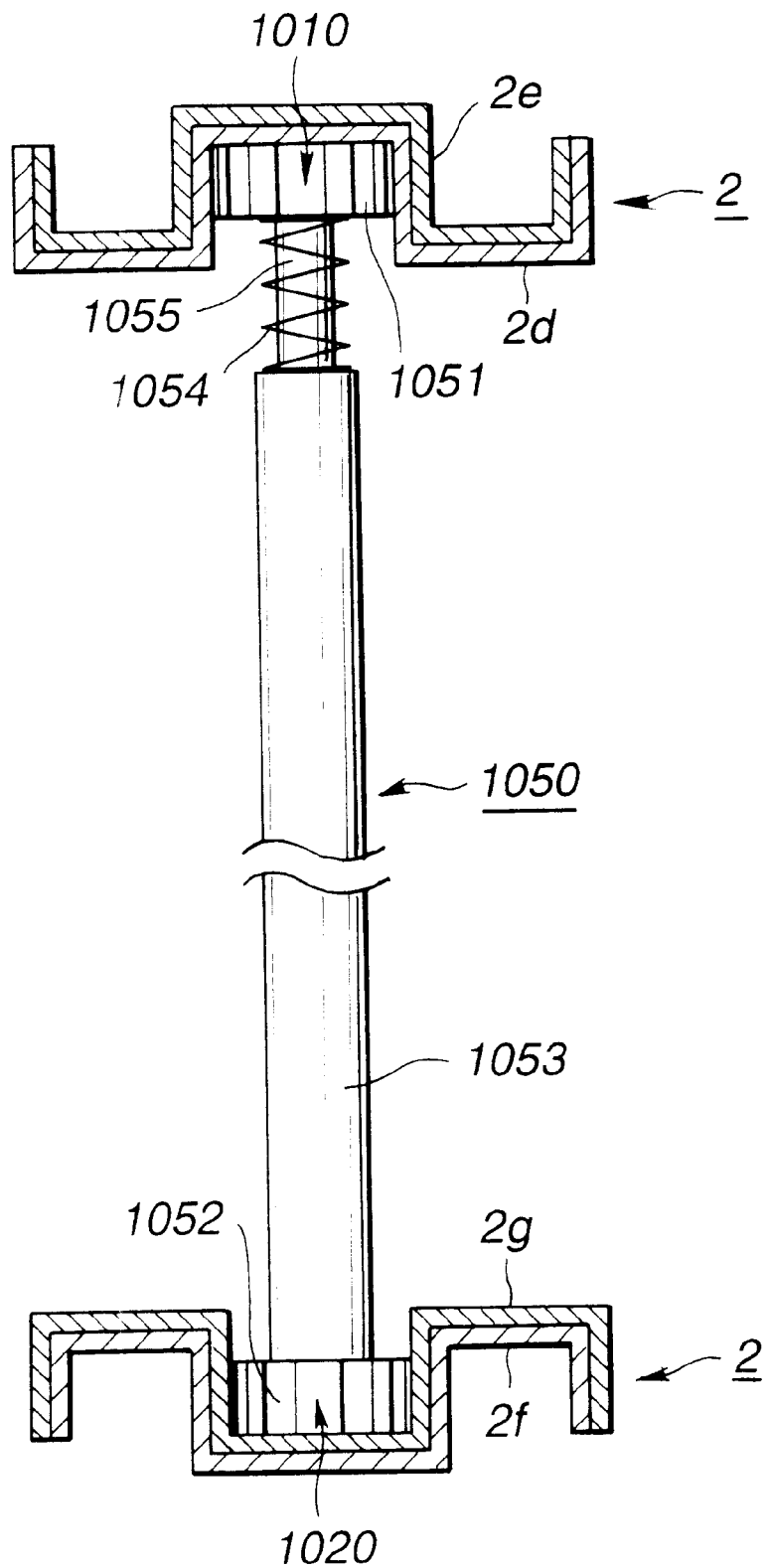
FIG. 18 shows an illustrative partitioning member arranged between connecting members of FIG. 17.

The connecting pieces 2d, 2e of the upper connecting member 2 are warped to present recesses 1010, as shown in FIG. 18. Similarly, the connecting pieces 2f, 2g of the lower connecting member 2 are warped to present recesses 1020. These recesses 1010, 1020 face each other.

Figure 19:
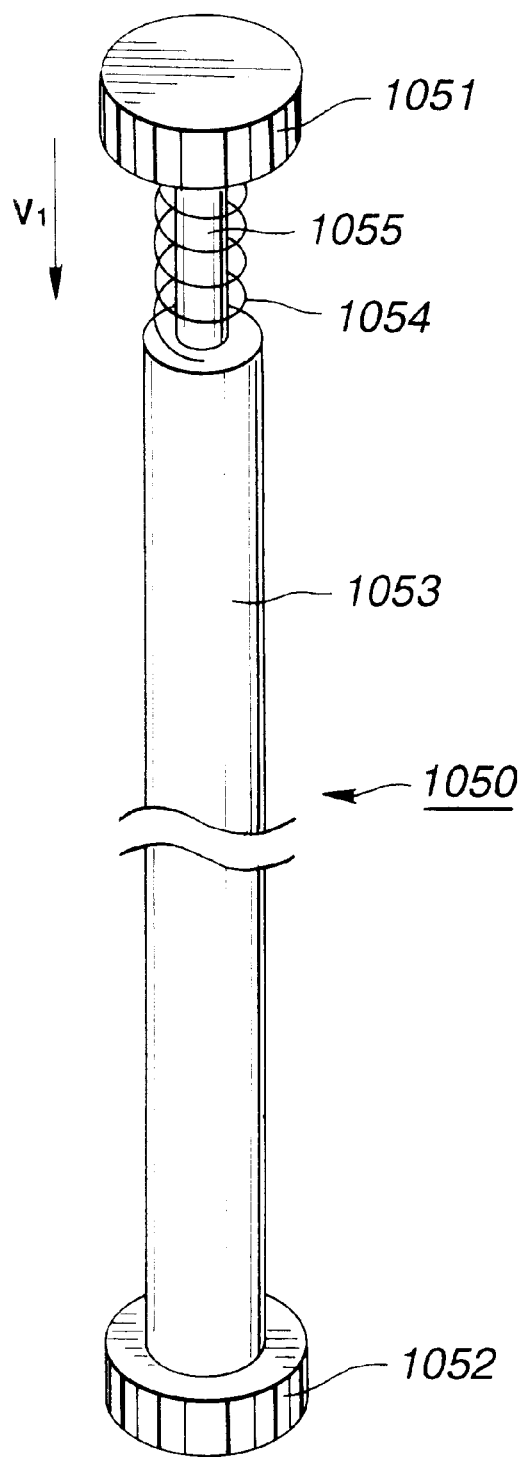
FIG. 19 is a perspective view showing a partitioning member of FIG. 18.

Between the recesses 1010 and 1020, there can be secured a partitioning member 1050 operating as space subdividing means. This partitioning member 1050 is preferably a rod-shaped member, as shown in FIGS. 18 and 19, and includes an end 1051, an opposite side end 1052, a rod 1053 and a spring 1054. The end 1051 is formed as one with a shank 1055 which is biased by a spring 1054, as biasing means, towards ne end of the rod 1053. The opposite side end 1052 is formed as-one with the opposite end of the rod 1053.

Thus, by thrusting the end 1051 in the direction indicated by arrow V1 in FIG. 19, the entire length of the partitioning member 1050 can be changed along the axial direction against the force of the spring 1054. Since the upper connecting member 2 and the lower connecting member 2 are positioned in vertically registering positions, as shown in FIG. 18, the partitioning member 1050 can be mounted by fitting it in position between the recesses 1010 and 1020 of the connecting members 2, 2 against the force of the spring 1054, as shown in FIG. 18. The partitioning member 1050 can easily be dismounted by shifting the rod 1053 against the force of the spring 1054 and by disengaging the opposite end 1052 from the recess 1020.

Figure 20:
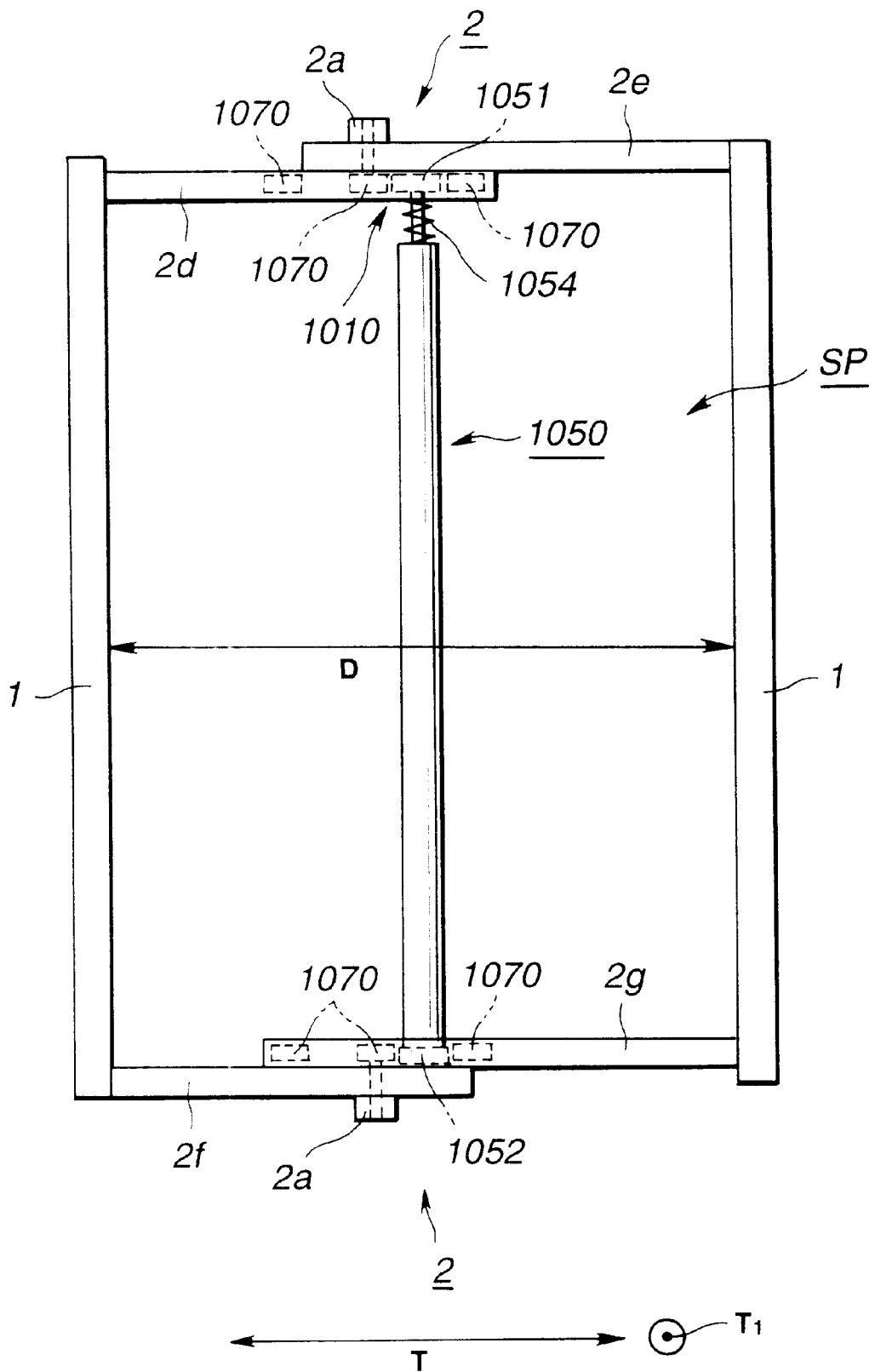
FIG. 20 is a front view showing the partitioning member arranged in the housing device.
Figure 22:
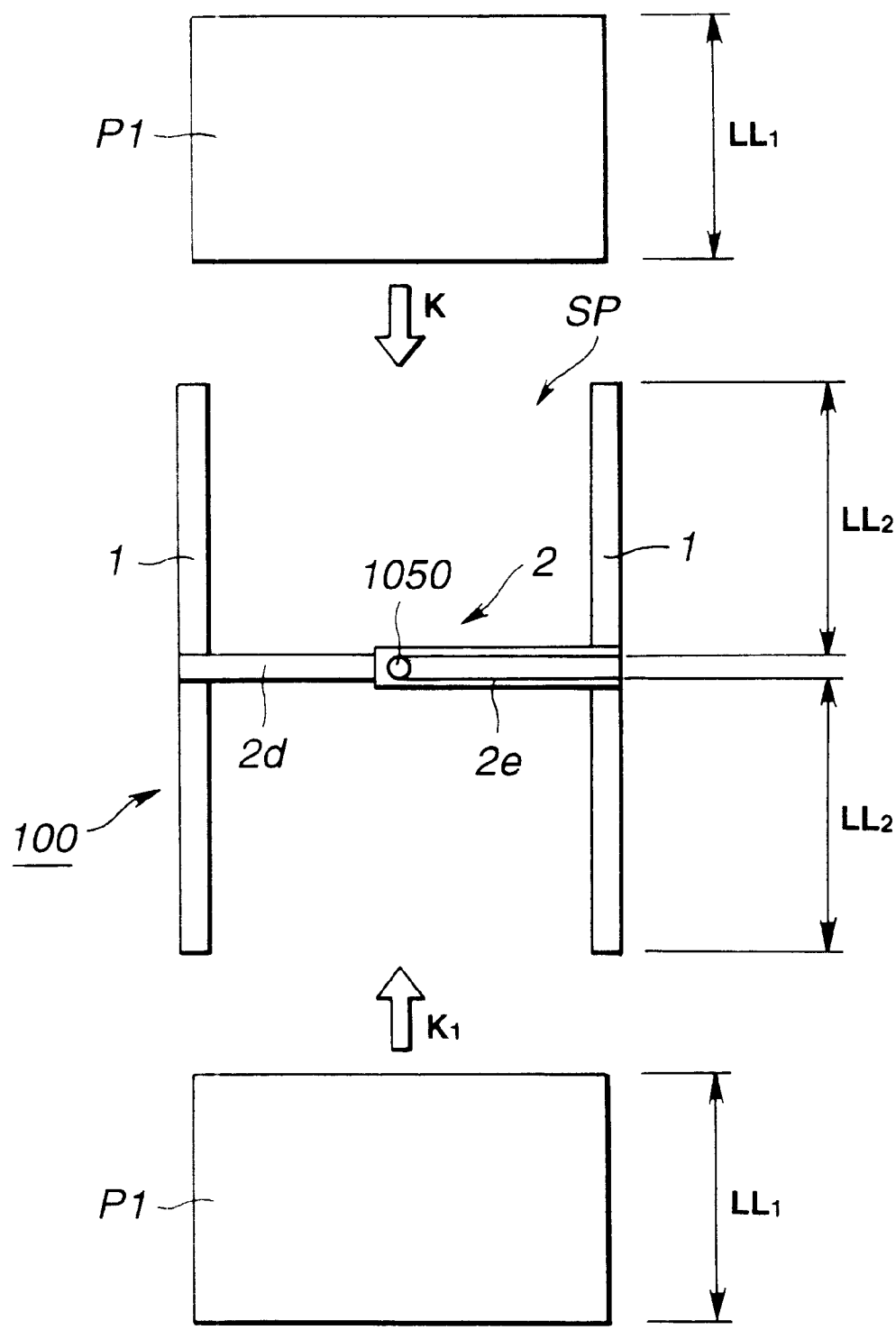
FIG. 22 is a plan view showing an illustrative component housing device and an illustrative printed circuit board housed therein.

FIGS. 16 and 20 show the manner in which the partitioning member 1050 is arranged between the upper connecting member 2 and the lower connecting member 2. This partitioning member 1050 subdivides the housing space SP, defined by the printed circuit board housing plates 1, 1, into two, as shown in FIGS. 20 and 22.

Referring to FIGS. 20 and 16, the upper connecting member 2 and the lower connecting member 2 can be interconnected by inserting the set screw 2a into one of nuts 1070. That is, the connecting pieces 2d, 2e or 2f, 2g can be reliably and detachably interconnected at mid portions by screwing the set screw 2a to a selected one of the nuts 1070.

By selecting one of the nuts, the separation D between the printed circuit board housing plates 1, 1 can be adjusted as desired. A number of the nuts 1070 are arranged within the recesses 1010 and 1020 and secured at a preset interval such as by welding. By screwing the set screw 2a in a selected one of these nuts 1070, a structure of the printed circuit board housing plates 1, 1 and the connecting members 2, 2 as shown in FIG. 20 can be constructed to set the separation D between the printed circuit board housing plates 1, 1. If the set screw 2a can be removed and screwed in another of the nuts 70, the separation D between the printed circuit board housing plates 1, 1 can be varied with respect to the direction of the arrow T.

These nuts 1070 operate as positioning members for the above-mentioned partitioning member 1050. Specifically, a plurality of, herein three, nuts are arrayed serially in the connecting pieces 2d, 2g, in the embodiment of FIG. 20. The end 1051 of the partitioning member 1050 is placed in the recess 1010 of FIG. 18 between the neighboring nuts 1070, 1070, as shown in FIG. 20, while the opposite side end 1052 of the partitioning member 1050 is arranged between the neighboring nuts 1070, 1070.

The ends 1051, 1052 are positioned in this manner by the nuts 1070, 1070 in the direction indicated by arrow T, and thus the partitioning member 1050 is prohibited from being moved sporadically. In addition, since the ends 1051, 1052 are positioned in the recesses 1010, 1020, as shown in FIG. 18, the partitioning member 1050 can be positioned without being sporadically moved in the direction indicated by arrow T1, that is in a direction perpendicular to the direction T.

Figure 21:
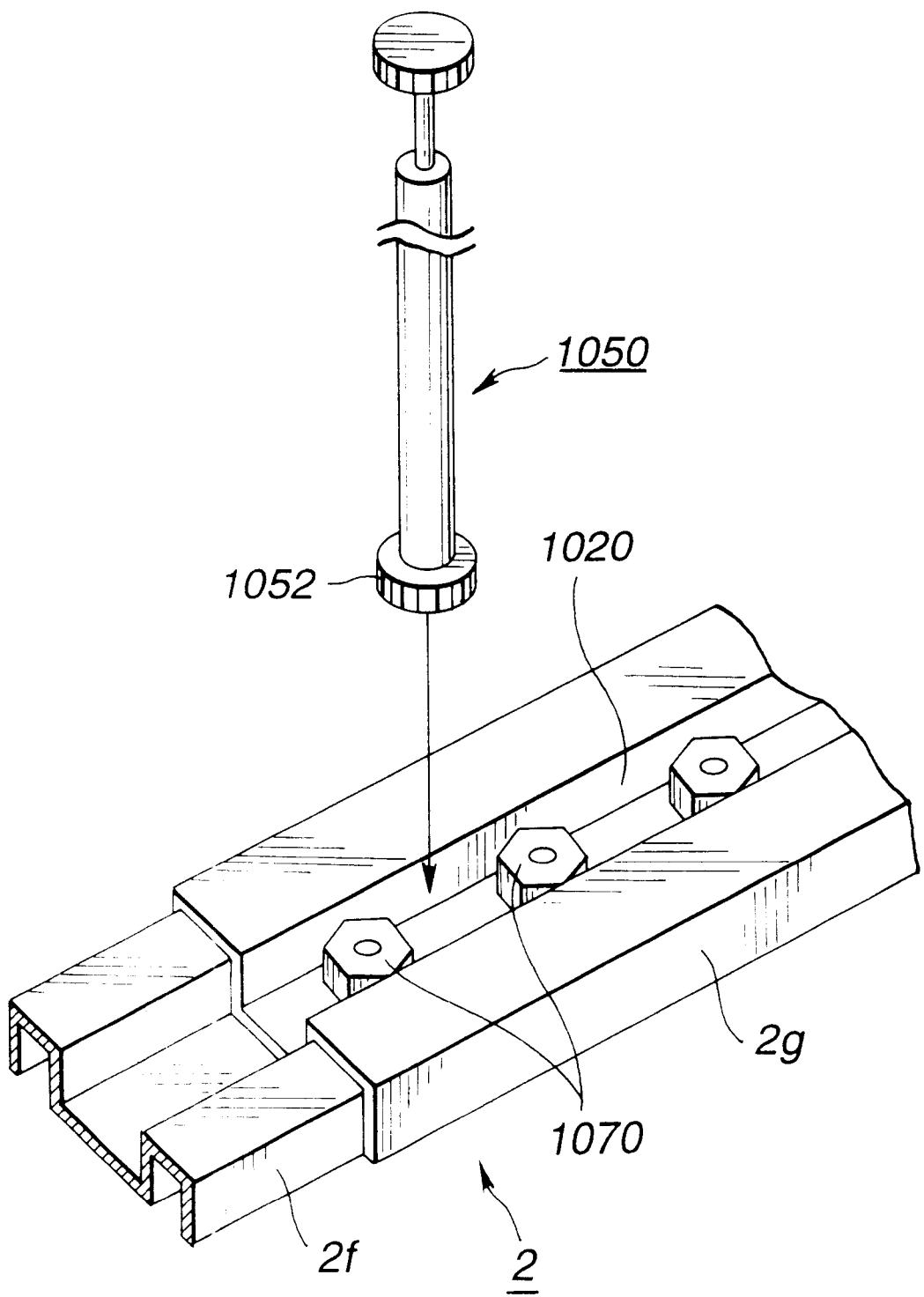
FIG. 21 is a perspective view showing an illustrative partitioning member and an illustrative lower connecting member.

FIG. 21 shows an embodiment in which the opposite side end 1052 of the partitioning member 1050 in the vicinity of the connecting pieces 2g and 2f of the lower connecting member 2 is arranged between neighboring nuts 1070, 1070.

In FIG. 20, the ends 1051, 1052 of the partitioning member 1050 can be arranged between the other nuts 1070, 1070. This assures position adjustment of the partitioning member 1050 in the direction indicated by arrow T. The number of positions possible for the partitioning member 1050 can be increased further by increasing the number of the nuts 1070.

FIG. 22 shows the component housing device 100 of FIG. 16 from above. Specifically, FIG. 22 shows the upper connecting member 2 and the left and right printed circuit board housing plates 1, 1. The partitioning member 1050 is already mounted in position between the upper connecting member 2 and the lower connecting member 2. FIG. 22 also shows printed circuit boards P. The printed circuit board P1 has a length LL1 smaller than the size LL2 of the housing space SP in the component housing device 100. Thus, if the printed circuit board P1 is inserted into grooves of the printed circuit board housing plates 1, 1 in the direction indicated by arrow K, the printed circuit board P1 compresses against the partitioning member 1050. If the other printed circuit board P1 is inserted in the direction indicated by arrow K1 into the grooves of the printed circuit board housing plates 1, 1, the printed circuit board P1 compresses against the partitioning member 1050. Thus, the printed circuit boards P1 of a relatively small size can be inserted and housed from the two directions indicated by arrows K and K1. A large number of printed circuit boards P1 of a relatively small size can be housed in the component housing device 100.

In FIGS. 20 and 22, the partitioning member 1050 is preferably positioned at a mid portion in the housing space SP along the depth of the component housing device 100. That is, the partitioning member 1050 is preferably positioned at a mid position of the connecting members 2, 2,.

In FIG. 20, the separation D between the printed circuit board housing plates 1, 1 can be changed by removing a set screw or bolt 2a from a specified nut 1070 and by screwing it into another nut 1070. That is, it suffices if the left side circuit board housing plate 1 is moved towards left and the right-side circuit board housing plate 1 is moved towards right. In this case, the positions of the nuts 1070, 1070 into which are screwed the end 1051 and the other end 1052 of the partitioning member 1050 are changed. If the number of the nuts 1070 is increased, the mounting position of the partitioning member 1050 intermediate the connecting members 2, 2 can be set rather freely. If the size of extension or contraction of the spring 1054 of the partitioning member 1050 is selected to be larger, any possible difference in the separation between the connecting members 2, 2, which may be caused by the differential housing capacity of the component housing device 100, can be coped with.

By the above arrangement, the number of the printed circuit boards P1 that can be accommodated in the component housing device 100 of FIG. 16 can be doubled, thus reducing the space for goods in process employing the component housing device 100 by one half, while the physical distribution efficiency can be doubled. In addition, the number of the component housing devices 100 can also be reduced.

In the embodiments of the present invention, two printed circuit boards of relatively small size can be housed in the component housing device 100 for printed circuit boards from opposite directions by being fitted in the same groove, thus increasing the number of printed circuit boards that can be accommodated in the component housing device 100. Since the partitioning member 1050 has the function of extending and contracting, the mounting/dismounting operation for the partitioning member 1050 can be realized extremely easily. If the number of the nuts 1070 is increased, the partitioning member 1050 can be positioned at a mid portion along the length of the printed circuit board housing plates 1, 1 in FIG. 20 even if the separation between the printed circuit board housing plates 1, 1 is changed.

The printed circuit board housing plates 1, 1 are symmetrically shaped in the left-and-right direction. Moreover, if the component housing device 100 is reversed in its position by 180°, the inserting and withdrawing operation for the printed circuit boards P1 can be easily carried out easily by the same operation. In this manner, the printed circuit boards can be easily housed and taken out without requiring any particular adjustment operations by an automatic adjustment device.

The base member 103 of FIGS. 1 to 3 or FIG. 16 is provided with two movable thrusting members 200, 202 and stationary thrusting members 201, 203. In this case, the lock operation by the four lock units 102 can be simultaneously released by the associated four thrusting members 200 to 203.

The four thrusting members 200 to 203 can be set for movement in the direction indicated by arrow T. The direction of movement of the thrusting members 200 to 203 can also be selected to differ from the arrow T direction.

The thrusting members 200 to 203 can be detachably mounted on the upper surface 103A of the base member 103. The positioning pins 190, 190 of FIG. 1 may also be of any desired shape other than the pin shape.

Although the components housed in the component housing device 100 in the above-described embodiments are printed circuit boards, the component housing device of the present invention may be applied to housing the disc-shaped recording mediums or components used in an arbitrary technical field in multiple tiers.

According to the present invention, printed circuit boards to be housed are normally locked and the locked state of the components housed in the component housing device can be automatically released by simply placing the support to enable a larger number of components to be housed in trim order if desired.

What is claimed is:

1. A component housing device for housing a plurality of components, comprising:
a holding support for removably holding the components on top of each other;
locking means mounted on outboard edges of the holding support and being biased to a locked position for preventing the components housed in the holding support from ejecting therefrom; and
a base having unlocking means mounted thereon for releasing the locking means when the holding support is set thereon, wherein the locking means in the locked position prohibits sporadic movements of the components housed in the support and wherein the unlocking means includes a thrusting member for actuating the locking means upon setting the holding support on the base and for holding the locking means in an unlocked position, which permits the components housed in the component housing device to be moved, from the locked position where movement of the housed components is prohibited.

2. The component housing device according to claim 1 wherein the thrusting member rotates the locking means and holds the locking means in the unlocked position.

3. The component housing device according to claim 1 wherein the thrusting member can be moved and repositioned on the base.

4. The component housing device according to claim 1 wherein the base has positioning means for positioning the support relative to the base when the support is set on the base.

5. The component housing device according to claim 1 wherein the support is made up of a first housing member and a second housing member arranged in parallel and connected together.

6. The component housing device according to claim 1 wherein each component of the plurality of components is a printed circuit board, wherein a plurality of printed circuit boards are inserted in grooves in the support and wherein distance between the first housing member and the second housing member can be varied.

7. A component housing device for housing a plurality of components, comprising:
a holding support for removably holding the components on top of each other;
locking means mounted on outboard edges of the holding support and being biased to a locked position for preventing the components housed in the holding support from ejecting therefrom; and
a base having unlocking means mounted thereon for releasing the locking means when the holding support is set thereon, wherein the locking means in the locked position prohibits sporadic movements of the components housed in the support, and wherein the holding support is made up of a first housing member and a second housing member arranged facing each other in parallel and connected together, wherein the locking means includes;
a rotatable lock bar arranged on at least one of the first housing member and the second housing member and extending along the direction of the housing array of the components, biasing means for biasing the lock bar into a locked position thereby preventing the movement of the components housed between the first housing member and the second housing member; and
positioning means for positioning the lock bar into a locked position thereby preventing the movement of the components housed between the first housing member and the second housing member and an unlocked position for inserting and removing the components from the space between the first and second housing members.

8. The component housing device according to claim 7 wherein, when the first housing member and the second housing member are set on the base, the unlocking means of the base shifts the lock bar against the force of the biasing means thereby changing the lock bar position from a locked position where movement of the housed component is prohibited to a first unlocked position where movement of the component is permitted, and wherein, when the first housing member and the second housing member are set on the base and upon the removal of a second actuating member, the unlocking means of the base shifts the lock bar to a second unlocked position under the force of the biasing means.

9. A component housing device for housing a plurality of components, comprising:
a support having a first housing member and a second housing member, wherein the support is arranged to hold the components one above the other when the components are inserted between the first housing member and the second housing member;
locking means mounted on outboard edges of the first housing member and second housing member and being biased to a locked position for preventing the components housed in the support from ejecting from the support;
a base having unlocking means mounted thereon for releasing the locked position of the locking means, wherein the locking means prohibits the movement of the components housed in the support, when the support is set on the base;
first connection means for maintaining a given distance between the first housing member and the second housing member of the support at a first position;
second connection means for maintaining a given distance between the first housing member and the second housing member of the support at a second position; and
space subdividing means arranged between the first connection means and the second connection means for subdividing the space for housing plural components located between the first housing member and the second housing member, wherein the space subdividing means is detachably mounted under a biasing force between the first connection means and the second connection means.

10. The component housing device according to claim 9 wherein each component of the plurality of components is a printed circuit board, wherein a first printed circuit board is inserted from one side of the support to compress against the space subdividing means and wherein a second printed circuit board is inserted from the opposite side of the support to compress against the space subdividing means, whereby the printed circuit boards are accommodated in the support.

11. A component housing device for housing a plurality of components, comprising:
a support having a first housing member and a second housing member, wherein the support is arranged to hold the components one above the other when the components are inserted between the first housing member and the second housing member;

locking means mounted on outboard edges of the first housing and the second housing and being biased to a locked position for preventing the components housed in the support from ejecting from the support;

a base having unlocking means mounted thereon for releasing the locked position of the locking means, wherein the locking means prohibits the movement of the components housed in the support, when the support is set on the base;

first connection means for maintaining a given distance between the first housing member and the second housing member of said support at a first position;

second connection means for maintaining a given distance between the first housing member and the second housing member of the support at a second position; and space subdividing means arranged between the first connection means and the second connection means for subdividing the space for housing plural components located between the first housing member and the second housing member, wherein the space subdividing means is a rod which is extendable axially against a force of biasing means and wherein the separation between the first housing member and the second housing member is adjustable by the first and second connection means of the space subdividing means.

12. A component housing device for housing a plurality of components, comprising:

a support having a first housing member and a second housing member, wherein the support is arranged to hold the components one above the other when the components are inserted between the first housing member and the second housing member;

locking means mounted on outboard edges of the first housing and the second housing and being biased to a locked position for preventing the components housed in the support from electing from the support;

a base having unlocking means mounted thereon for releasing the locked position of the locking means, wherein the locking means prohibits the movement of the components housed in the support, when the support is set on the base;

first connection means for maintaining a given distance between the first housing member and the second housing member of said support at a first position;

second connection means for maintaining a given distance between the first housing member and the second housing member of the support at a second position; and space subdividing means arranged between the first connection means and the second connection means for subdividing the space for housing plural components located between the first housing member and the second housing member, wherein the first connection means has a positioning member for positioning an end of the space subdividing means and wherein the second connection means has a positioning member for positioning the opposite end of the space subdividing means.

* * * * *